United States Patent [19]

Lackner et al.

[11] 4,184,908
[45] Jan. 22, 1980

[54] METHOD FOR POLISHING CADMIUM SULFIDE SEMICONDUCTORS

[75] Inventors: Anne M. Lackner, Los Angeles; Phillip G. Reif, Chatsworth, both of Calif.

[73] Assignee: The United States of America as represented by the Secretary of the Navy, Washington, D.C.

[21] Appl. No.: 949,282

[22] Filed: Oct. 5, 1978

[51] Int. Cl.$^2$ ............................................. H01L 21/306
[52] U.S. Cl. ..................................... 156/636; 134/34; 156/903; 252/79.1
[58] Field of Search ................. 156/636, 637, 638, 639, 156/645, 650, 651, 662, 903, 345; 252/79.1, 79.2, 79.3, 79.4; 51/283, 326; 134/3, 7, 26, 28, 32, 33, 34

[56] References Cited

U.S. PATENT DOCUMENTS

| 3,156,596 | 11/1964 | Sullivan | 156/637 |
| 3,262,825 | 7/1966 | Fuller | 156/662 |
| 3,595,718 | 7/1971 | Fishman et al. | 156/668 |
| 3,629,023 | 12/1971 | Strehlow | 156/636 |
| 4,064,660 | 12/1977 | Lampert | 51/283 |
| 4,070,797 | 1/1978 | Griesshammer et al. | 51/326 |
| 4,108,716 | 8/1978 | Pritchard et al. | 156/636 |

OTHER PUBLICATIONS

GEOS Technical Report 103, entitled, "Polishing Procedures for Compound Semiconductors and Intermetallic Compounds".

J. Electrochem Society (1962), vol. 109, p. 880 by Fuller et al., entitled, "A Polishing Etchant for III–V Semiconductors".

J. Electrochem Society (1963), vol. 110, entitled, "The Chemical Polishing of Gallium Arsenide in Bromine—Methanol", by Sullivan et al. pp. 585–587.

J. Electrochem Society (1971), vol. 118, entitled, "Evaluation of a New Polish for Gallium Arsenide Using a Peroxide—Alkaline Solution" by Dyment et al., pp. 1346–1350.

Primary Examiner—William A. Powell
Attorney, Agent, or Firm—R. S. Sciascia; Paul S. Collignon

[57] ABSTRACT

A method for polishing semiconductors, particularly surfaces of CdS. The method is comprised of polishing a substrate with a pad charged with Transene and Cab-O-Sil while an iodine solution is added in small quantities. The last period of polishing is done while flushing the polishing pad with Transene. Upon completion of polishing, the substrate is given an immediate wash with Transene, followed by ultrasonic cleaning in Transene. After the ultrasonic cleaning, the substrate is again rinsed in Transene and then spun dried. The cleaning process is continuous and the cleaning solutions are kept in active contact with the substrate in order to provide a haze-free product.

7 Claims, No Drawings

METHOD FOR POLISHING CADMIUM SULFIDE SEMICONDUCTORS

BACKGROUND OF THE INVENTION

The present invention relates to a process for polishing semiconductors and more particularly to a process for polishing substrates of CdS.

In the fabrication of semiconductor devices, it is essential to prepare the starting material into substrates having flat, smooth damage-free surfaces. A highly polished, extremely clean and flat CdS surface is necessary for a good reflective mode liquid crystal light valve.

Several techniques such as electropolishing, chemical etching and mechanical lapping and polishing surfaces of semiconductor slices are well known and presently in use in the semiconductor art. By lapping and polishing techniques a surface can be prepared which is about 0.0001 inch per inch flat. The average roughness of this surface is typically 0.3 microinch. The resultant surfaces are smooth and flat enough for satisfactory device fabrication but the mechanical damage which is still present on the surface deleteriously affects the electrical characteristics of devices. Typically, it is necessary to remove such damaged surfaces prior to further processing by chemically etching the surfaces. Unfortunately, chemical etching with conventional etchants, such as aqua regia or mixtures of nitric and hydrofluoric acids, increases the average roughness of a typical surface to about 3.0 microinches or greater. Thus, the gain in removing mechanical damage by the chemical etching technique is obtained at the expense of increasing the average roughness.

In U.S. Pat. No. 3,262,825, entitled, "Method For Etching Crystals of Group III(a)–V(a) Compounds and Etchant Used Therefor", which issued July 26, 1966, to Calvin S. Fuller, there is disclosed an etchant and method for polishing substrates of gallium arsenide and gallium phosphide. The etchant is comprised of a non-aqueous mixture of an organic compound selected from among glacial acetic acid and methanol and a material selected from the group consisting of a halogen selected from among chlorine, bromine and iodine.

A method for making haze-free surfaces of semiconductor bodies is disclosed in U.S. Pat. No. 4,070,797, which issued Jan. 31, 1978, to Rudolf Griesshammer and Gunther Lechner. In this patented process, the surface of a substrate is first polished using either quartz, silica, silicates and fluosilicates and a second polishing of the surface is done with one of the named agents to which a nitrogen-free surfactant has been added.

SUMMARY OF THE INVENTION

The present invention relates to a method for polishing flat CdS surfaces. A CdS substrate is polished with a pad charged with Transene and Cab-O-Sil, and a solution of iodine and Transene is added in small quantities as the polishing takes place. The polishing cycle is terminated with a two minute polishing with Transene only, as a first step in a cleaning process. After the polishing, the substrate is given an immediate rinse in Transene followed by an immediate ultrasonic cleaning in fresh Transene. After the ultrasonic cleaning, the substrate is again rinsed with Transene and then given a spin dry.

It is therefore a general object of the present invention to provide an improved method for polishing CdS substrates.

Another object of the present invention is to provide a polishing and cleaning method for CdS substrates which provides haze-free substrates.

Other objects, advantages and novel features of the present invention will become apparent from the following detailed description of the invention.

DESCRIPTION OF THE PREFERRED EMBODIMENT

The textured surface of a polycrystalline CdS photoconductor film is the main source of surface roughness in a light valve, and this roughness leads to reduced on-to-off current ratios and reduced device speed. Reduced device speed leads to poor reflectivity of the mirror and, thereby, a degradation of the contrast. Furthermore, after a relatively short operation time, cosmetic defects appear. While surface roughness can be eliminated by polishing, it is extremely important that the CdS surface be extremely clean and undamaged after polishing. Every site of crystal damage or impurity creates a trap site, thereby slowing the response of the device and limiting the thickness of the depletion layer.

According to the present invention, good chemo-mechanical polishing is achieved on evporated CdS by etching with a solution of iodine and mechanical polishing with Cab-O-Sil in Transene-100. Cab-O-Sil, which is manufactured by Cabot Corporation, is a submicroscopic fumed silica with very high chemical purity and extreme fineness. (Particle size from 70 to 500 Å.) Transene-100 is a proprietary solvent manufactured by Transene Company, Inc., Rowley, Mass. 01969. Transene 100 is an alcohol-hydrocarbon liquid base solvent containing a volatile wetting agent. The chemo-mechanical technique provides an excellent polish to CdS surfaces and has negligible effect on the photoelectrical properties of the CdS. This method, however, leaves behind a haze on the surface of the CdS after polishing, if a cleaning operation is not used in conjunction with the chemo-mechanical polishing operation.

Accurate control over polishing speed, etchant flow and interaction time can best be achieved if a polishing machine is used. By way of example, a Lapmaster 12 machine, which is made by Crane Packing Co. can be used. One or more polishing pads may be employed (to polish multiple number of CdS surfaces) and each polishing pad is pre-charged with a solution of Transene-100 and Cab-O-Sil, in the proportion of 10 percent Cab-O-Sil and 90 percent Transene-100. As the polishing pad is rotated, a solution of 2 percent iodine in Transene-100 is introduced by pipette feed. Excellent results can be obtained by limiting the iodine solution rate to about one drop per second so that relatively dry pad is maintained. The polishing cycle is terminated with a two minute polishing with Transene-100 only, which is the first step in the cleaning process.

It was assumed that surface haze on the CdS substrates was produced by continued chemical etching taking place after removal from the polishing machine but before removal of the etchant from the surface of the substrate. The following-described cleaning procedure was successful in providing haze-free surfaces. First, the polishing cycle was completed using a two minute flush of the polishing pads with Transene-100. Upon removal of CdS substrates from the polishing machine, the substrates were given an immediate rinse with Transene-100 followed by an immediate ultrasonic cleaning in fresh Transene. By way of example, this ultrasonic cleaning step might be for 10 minutes. After the ultrasonic cleaning step, the substrates are again rinsed with Transene-100 and then dried by spinning the substrates. In order to produce haze-free surfaces, it is important to keep the cleaning solutions in active contact with the substrate and the cleaning process must be continuous to be effective.

Obviously many modifications and variations of the present invention are possible in the light of the above teachings. It is therefore to be understood that the invention may be practiced otherwise than as specifically described.

We claim:

1. A process for preparing a haze-free cadmium sulfide surface on a substrate by polishing which comprises subjecting said surface to the polishing action of a solution containing submicroscopic silica and simultaneously, while polishing, etching said surface with an iodine solution, and then cleaning said surface before said iodine solution dries on said surface.

2. A process for preparing a haze-free cadmium sulfide surface on a substrate as set forth in claim 1 wherein the last stage of polishing is done without adding said iodine solution and, while polishing, the polishing pads are flushed with a cleaning solvent.

3. A process for preparing a haze-free cadmium sulfide surface on a substrate as set forth in claim 1 wherein said iodine solution contains about 2 percent of iodine.

4. A process for preparing a haze-free cadmium sulfide surface on a substrate as set forth in claim 1 wherein said solution containing submicroscopic silica contains about 20 percent of silica.

5. A process for preparing a haze-free cadmium sulfide surface on a substrate as set forth in claim 1 including the steps of immediately removing said substrate upon completion of polishing, then flushing said cadmium sulfide surface with a cleaning solution and then immediately ultrasonically cleaning said surface.

6. A process for preparing a haze-free cadmium sulfide surface on a substrate as set forth in claim 5 including the steps of again flushing said surface with a cleaning fluid after ultrasonic cleaning has been completed and then spin drying said substrate.

7. A process for preparing a haze-free cadmium sulfide surface on a substrate as set forth in claim 1 wherein said polishing is done with a polishing machine.

* * * * *